United States Patent
Kim et al.

(10) Patent No.: US 7,423,864 B2
(45) Date of Patent: Sep. 9, 2008

(54) PLASMA DISPLAY DEVICE

(75) Inventors: Sok-San Kim, Suwon-si (KR);
Tae-Kyoung Kang, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 519 days.

(21) Appl. No.: 11/148,198

(22) Filed: Jun. 9, 2005

(65) Prior Publication Data
US 2006/0044744 A1 Mar. 2, 2006

(30) Foreign Application Priority Data
Aug. 24, 2004 (KR) .................. 10-2004-0066653

(51) Int. Cl.
*H05K 5/00* (2006.01)
*H05K 7/00* (2006.01)
*H01J 61/28* (2006.01)
*G09G 3/10* (2006.01)

(52) U.S. Cl. .................. 361/681; 313/231.31; 345/37; 345/41; 348/E3.014

(58) Field of Classification Search .................. 361/681; 345/37, 41; 313/231.31; 315/111.21, 111.71
See application file for complete search history.

(56) References Cited

U.S. PATENT DOCUMENTS

| 5,831,374 | A | * | 11/1998 | Morita et al. | 313/46 |
| 5,846,110 | A | * | 12/1998 | Kanagu et al. | 445/25 |
| 5,990,618 | A | * | 11/1999 | Morita et al. | 313/582 |
| 6,332,690 | B1 | * | 12/2001 | Murofushi | 362/611 |
| 6,876,150 | B2 | * | 4/2005 | Tanaka | 313/582 |
| 2002/0001187 | A1 | * | 1/2002 | Murofushi | 362/31 |
| 2003/0015963 | A1 | * | 1/2003 | Tanaka | 313/582 |
| 2005/0174301 | A1 | * | 8/2005 | Kim | 345/3.1 |
| 2005/0184631 | A1 | * | 8/2005 | Kim | 313/45 |
| 2005/0184664 | A1 | * | 8/2005 | Kang et al. | 313/583 |
| 2005/0194913 | A1 | * | 9/2005 | Kim et al. | 315/169.4 |

FOREIGN PATENT DOCUMENTS

JP  2003-132808  5/2003

* cited by examiner

*Primary Examiner*—Jayprakash N Gandhi
*Assistant Examiner*—Anthony M Haughton
(74) *Attorney, Agent, or Firm*—Robert E. Bushnell, Esq.

(57) ABSTRACT

A plasma display device comprises a plasma display panel, a chassis base for supporting the plasma display panel, and a circuit board assembly mounted on the chassis base with circuit elements for applying electrical signals required for driving the plasma display panel. The chassis base is bent with a curvature such that the curvature of the chassis base compensates for a curvature of the bent plasma display panel.

20 Claims, 3 Drawing Sheets

PLASMA DISPLAY DEVICE

CLAIM OF PRIORITY

This application makes reference to, incorporates the same herein, and claims all benefits accruing under 35 U.S.C. §119 from an application for PLASMA DISPLAY DEVICE earlier filed in the Korean Intellectual Property Office on Aug. 24, 2004 and there duly assigned Ser. No. 10-2004-0066653.

BACKGROUND OF THE INVENTION

1. Technical Field

The present invention relates to a plasma display device and, more particularly, to a plasma display device which solves a noise problem occurring at a panel.

2. Related Art

Generally, a plasma display panel (simply referred to hereinafter as the "panel") has barrier ribs disposed between a pair of glass substrates, and a pair of electrodes combined with the barrier ribs to form discharge cells. Within the panel, color phosphors are excited by ultraviolet rays generated during plasma discharge to display desired images.

The panel is modularized to make a display device. That is, the panel is combined with a chassis base, and a circuit board assembly fitted to the chassis base is connected to the panel, thereby completing the display device. With the modularization process, the panel may be further combined with a heat sink for releasing heat generated from the panel, and with covers for outlining the device.

Vibration and noise occur during the process of operating the panel. In order to solve such a problem, a vibration and noise absorption material may be provided between the panel and the chassis base.

Meanwhile, in the course of manufacturing the panel, the panel may become distorted due to heat treatment. For instance, the panel may be bent during firing which is carried out in order to harden the paste so as to form the barrier ribs or the electrodes.

Accordingly, with respect to the completed panel, although it is ideally expected that the front substrate and the rear substrate will tightly adhere to each other while interposing the barrier ribs, in practice, they are partially bent. For this reason, noise occurs at a gap between the front substrate and the rear substrate.

However, with only the noise absorption material simply disposed between the panel and the chassis base, the noise cannot be eliminated satisfactorily.

SUMMARY OF THE INVENTION

It is an object of the present invention to provide a plasma display device which eliminates noise occurring at the panel corners due to structural factors thereof.

This object and other objects are achieved by a plasma display device with the following features.

The plasma display device includes a plasma display panel, a chassis base for supporting the plasma display panel, and a circuit board assembly mounted on the chassis base with circuit elements for applying electrical signals required for driving the plasma display panel. The chassis base is bent with a curvature such that the curvature of the chassis base compensates for the curvature of the bent plasma display panel.

The plasma display panel and the chassis base are combined with each other using adhesive members, and the adhesive members are applied to the entire periphery of the plasma display panel as well as to the center of the panel.

The adhesive members applied to the center of the plasma display panel are, preferably, placed around the center of the panel opposite to each other in one or more pairs.

Heat release members are formed between the adhesive members.

Reinforcing members are fitted to the chassis base with a predetermined curvature so as to reinforce the structural rigidity of the chassis base, and the chassis base is bent by way of the reinforcing members. The reinforcing members are, preferably, fitted to the center of the chassis base.

The reinforcing members are fitted to the chassis base in the mounting direction of the circuit board assembly. The reinforcing member is, preferably, formed with a material having rigidity greater than that of the chassis base.

The chassis base is, preferably, bent with the same curvature as that of the plasma display panel.

The chassis base is, preferably, combined with the plasma display panel such that it is bent in a direction opposite to the direction of bending of the plasma display panel.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF PREFERRED EMBODIMENTS

The present invention will be described more fully hereinafter with reference to the accompanying drawings, in which preferred embodiments of the invention are shown.

Figure 1:
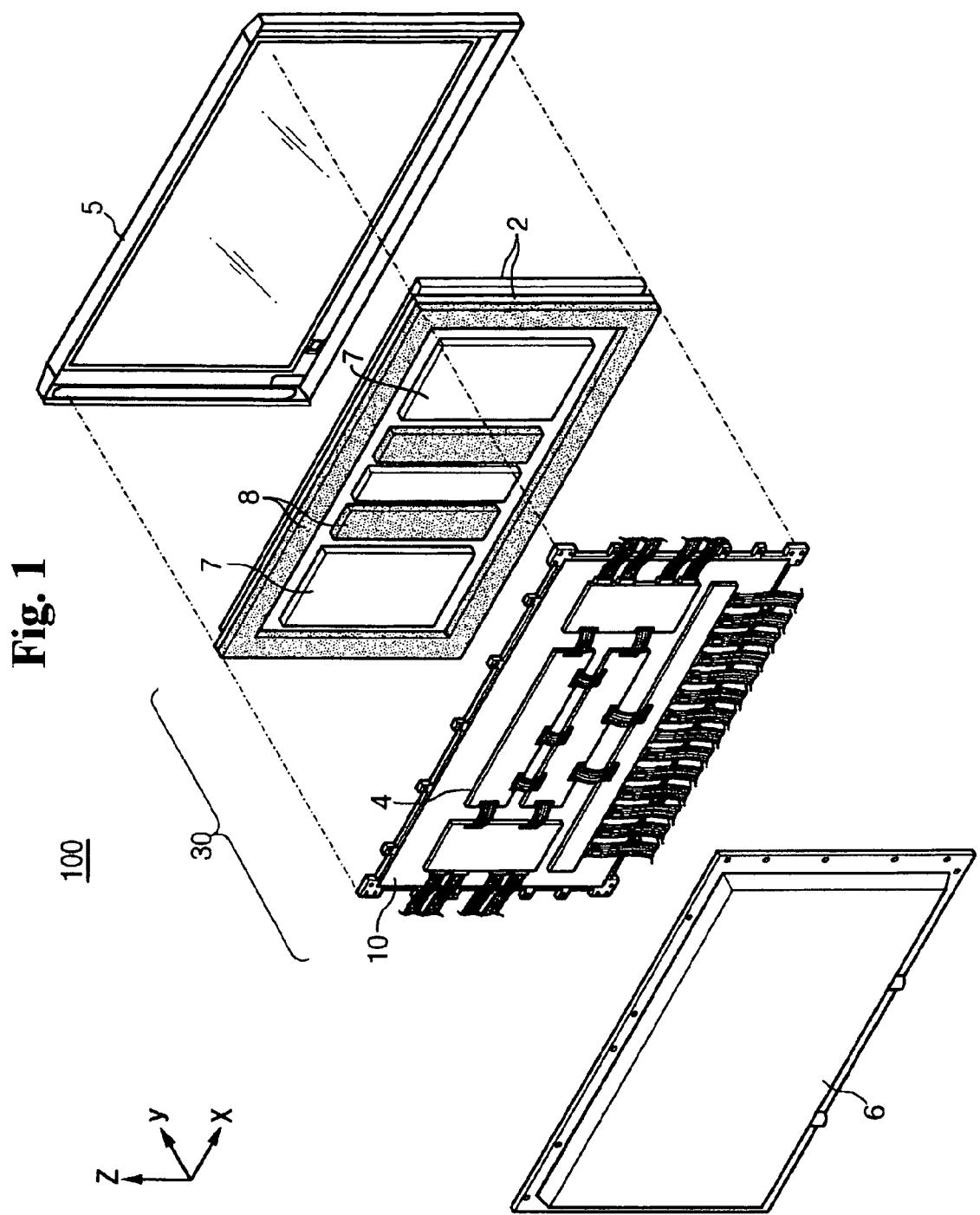
FIG. 1 is an exploded perspective view of a plasma display device according to an embodiment of the present invention.
Figure 2:
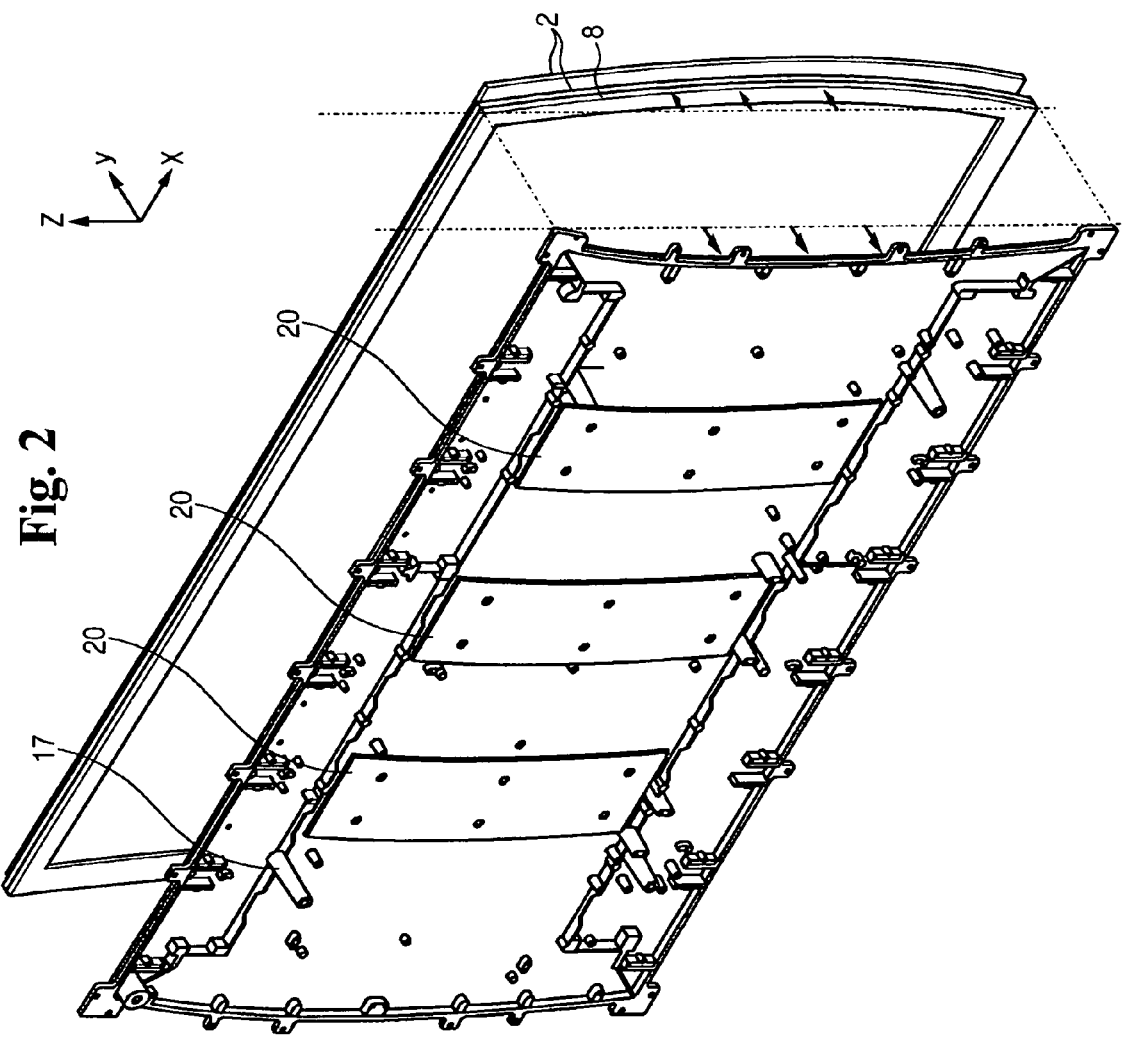
FIG. 2 is a perspective view of a chassis base and a plasma display panel of the plasma display device according to the embodiment of the present invention.
Figure 3:
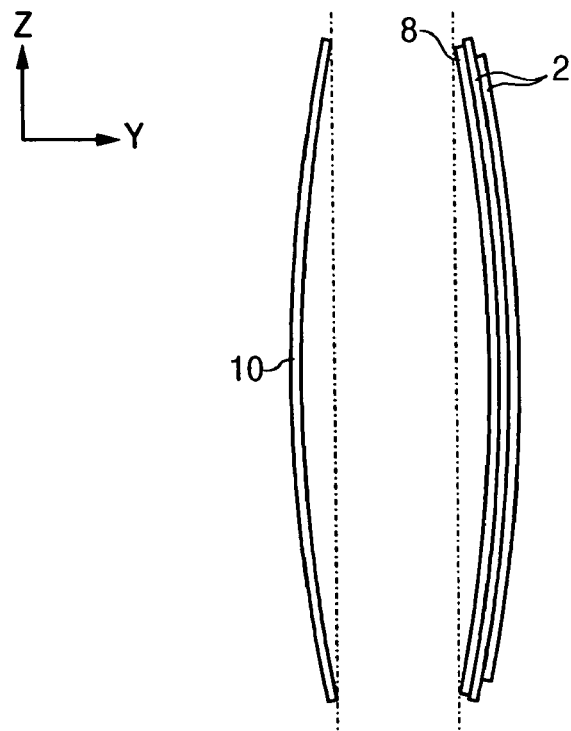
FIG. 3 is a side view of the chassis base and the plasma display panel of the plasma display device according to the embodiment of the present invention.

FIG. 1 is an exploded perspective view of a plasma display device according to an embodiment of the present invention, FIG. 2 is a perspective view of a chassis base and a plasma display panel of the plasma display device according to the embodiment of the present invention, and FIG. 3 is a side view of the chassis base and the plasma display panel of the plasma display device according to the embodiment of the present invention.

As shown in FIG. 1, the plasma display device 100 basically comprises a drive module 30, including a plasma display panel 2 (referred to as the "panel") and a chassis base 10 for supporting the panel 2. A circuit board assembly 4 is mounted on the chassis base 10. The chassis base 10 is bent with a predetermined curvature.

The drive module 30 is packaged within a front cabinet 5 placed at the front of the panel 2, and a back cover 6 combined with the front cabinet 5 in a body, while covering the rear of the chassis base 10.

In the panel 2, desired images are displayed by exciting phosphors with vacuum ultraviolet rays generated due to gas discharge therein. The panel 2 is outlined roughly in a rectangular shape.

The chassis base 10 is structurally rigid enough to support the panel 2. The circuit board assembly 4 is mounted on the chassis base 10. The chassis base 10 is structured such that the heat generated by the panel 2 and the circuit board assembly 4, as well as the electromagnetic interference thereof, can be effectively reduced. The chassis base 10 may be formed with a metallic material, such as aluminum, copper or iron.

As shown in FIGS. 2 and 3, the chassis base 10 is bent in a direction opposite to the bent direction of the panel 2. As illustrated in the drawings, the panel 2 is curved toward the back cover 6, and the chassis base 10 is curved toward the front cabinet 5. This structure will now be explained in detail, but the present invention is not limited thereto.

In order to form the bent chassis base 10, a plate for making the chassis base is warped and pressed. Alternatively, reinforcing members 20 may be used for that purpose.

The reinforcing members 20 are additionally fitted to the chassis base 10 so as to heighten the structural rigidity of the chassis base 10. Furthermore, the reinforcing members 20 are bent in the direction in which the chassis base 10 is bent. The reinforcing members 20 are fitted to the chassis base 10 so that the chassis base 10 is bent due to the stress of the reinforcing members 20. The rigidity of the chassis base 10 is, preferably, established so as to be lower than that of the reinforcing members 20.

Meanwhile, the reinforcing members 20 are coupled to the rear of the chassis base 10 so as to be mounted with the circuit board assembly 4 by using a TOX-like plate joint, rivets, or screws.

The reinforcing members 20 are, preferably, formed with a thin plate, which makes it easy to mount the circuit board assembly 4 on the chassis base 10 via a boss 17.

Considering the structural rigidity of the chassis base 10, a suitable number of reinforcing members 20 are preferably coupled to the chassis base 10.

The combined state of the panel 2 and the chassis base 10 will now be explained with reference to FIGS. 1 to 4.

Figure 4:
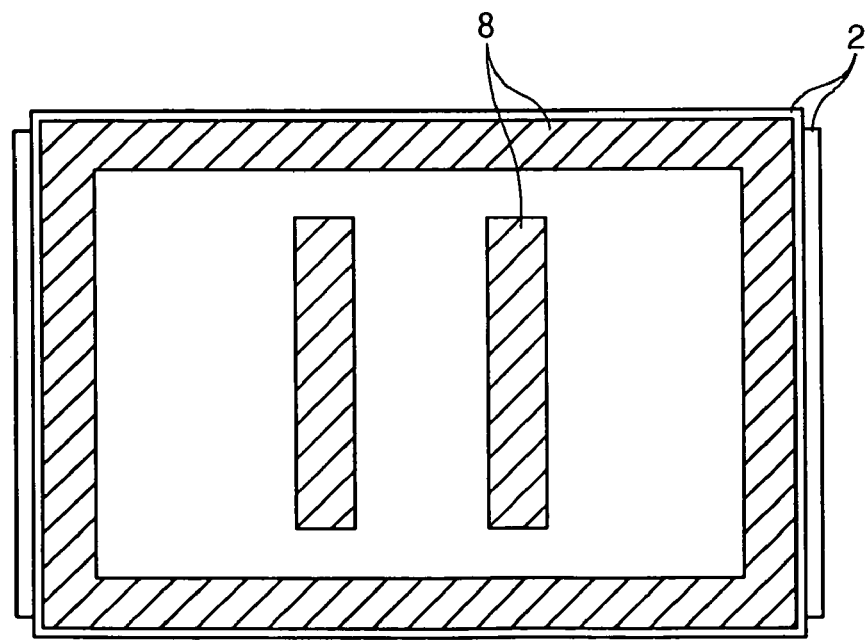
FIG. 4 illustrates the locations of adhesive members of the plasma display device according to the embodiment of the present invention.

FIG. 4 illustrates the locations of adhesive members 8 for attaching the panel and the chassis base to each other. The oblique lined region of FIG. 4 indicates the location of the adhesive members 8.

As shown in the drawings, with respect to the drive module 30 according to the present embodiment, adhesive members 8 are applied to the rear of the panel 2 so as to be attached to the chassis base 10. The chassis base 10 is attached to the panel 2 via the adhesive members 8.

A common double-sided tape is preferably used to form the adhesive members 8.

The adhesive members 8 are applied to the entire periphery of the panel 2, and to the center of the panel 2 so that the panel 2 and the chassis base 10 are combined with each other in a stable manner.

The number of the adhesive members 8 is determined based on physical characteristics of the panel 2 and the chassis base 10, such as the elastic coefficient and rigidity thereof.

An adhesive member 8 is, preferably, applied to the center of the panel 2 where the distance between the panel 2 and the chassis base 10 is greatest. Alternatively, two or more adhesive members 8 may be placed opposite to each other around the center of the panel 2.

Heat release members 7 may be provided between the adhesive members 8 to release the heat generated from the panel.

As described above, the adhesive members 8 are applied to the rear of the panel 2, and the chassis base 10 is series—attached to the panel 2.

The bent direction of the chassis base 10 is controlled so as to be opposite to the bent direction of the panel 2. Consequently, the chassis base 10 and the panel 2 become unbent while compensating for each other.

Thereafter, the circuit board assembly 4 is mounted on the rear of the chassis base 10 via the boss 17.

After the front cabinet 5 is coupled to the chassis base 10, the back cover 6 is combined with the chassis base 10 in a body, thereby completing the display device 100.

With the plasma display device according to the present invention, a noise problem occurring due to the distortion of the panel is solved. That is, the panel 2 is combined with the chassis base 10 bent in a direction opposite to the direction of bending of the panel 2 so that they become unbent while compensating for each other, thereby eliminating the noise occurring at the panel 2.

Moreover, the solving of the noise problem is made without separately providing a facility or part.

Although preferred embodiments of the present invention have been described in detail hereinabove, it should be clearly understood that many variations and/or modifications is of the basic inventive concept herein taught will appear to those skilled in the art and will still fall within the spirit and scope of the present invention, as defined in the appended claims.

What is claimed is:

1. A plasma display device, comprising: a plasma display panel which is bent so as to have a curvature; a chassis base for supporting the plasma display panel; and a circuit board assembly mounted on the chassis base and including circuit elements for applying electrical signals required for driving the plasma display panel; wherein the chassis base is bent with a curvature which offsets the curvature of the bent plasma display panel.

2. The plasma display device of claim 1, further comprising adhesive means for combining the plasma display panel and the chassis base, said adhesive means being applied to a periphery and a center of the plasma display panel.

3. The plasma display device of claim 2, wherein said adhesive means comprises adhesive members applied to the center of the plasma display panel and placed around the center of the plasma display panel opposite to each other in at least one pair.

4. The plasma display device of claim 2, wherein said adhesive means comprises adhesive members, and wherein heat release members are formed between the adhesive members.

5. The plasma display device of claim 1, further comprising reinforcing members fitted to the chassis base with a predetermined curvature so as to reinforce a structural rigidity of the chassis base, said chassis base being bent by the reinforcing members.

6. The plasma display device of claim 5, wherein the reinforcing members are fitted to the chassis base in a mounting direction of the circuit board assembly.

7. The plasma display device of claim 5, wherein the reinforcing members are formed with a material having a rigidity greater than the structural rigidity of the chassis base.

8. The plasma display device of claim 5, wherein the reinforcing members are fitted to a center of the chassis base.

9. The plasma display device of claim 1, wherein the curvature of the chassis base is in a direction opposite to the curvature of the plasma display panel.

10. The plasma display device of claim 1, wherein the chassis base is bent in a direction opposite to a direction of bending of the plasma display panel.

11. A plasma display device, comprising: a plasma display panel which is bent so as to have a curvature; a chassis base for supporting the plasma display panel, the chassis base being bent with a curvature offsetting the curvature of the plasma display panel; a circuit board assembly mounted on the chassis base and including circuit elements for applying electrical signals required for driving the plasma display panel; and adhesive means for combining the plasma display panel and the chassis base, said adhesive means being applied to a periphery and a center of the plasma display panel.

12. The plasma display device of claim 11, wherein said adhesive means comprises adhesive members applied to the center of the plasma display panel and placed around the center of the panel opposite to each other in at least one pair.

13. The plasma display device of claim 11, wherein said adhesive means comprises adhesive members, and wherein heat release members are formed between the adhesive members.

14. The plasma display device of claim 11, wherein curvature of the chassis base is the same as the curvature of the plasma display panel.

15. A plasma display device, comprising:
a plasma display panel which is bent so as to have a curvature;
a chassis base for supporting the plasma display panel;
a circuit board assembly mounted on the chassis base and including circuit elements for applying electrical signals required for driving the plasma display panel; and
reinforcing members fitted to the chassis base with a predetermined curvature so as to reinforce a structural rigidity of the chassis base, said chassis base being bent by the reinforcing members.

16. The plasma display device of claim 15, wherein the reinforcing members are fitted to the chassis base in a mounting direction of the circuit board assembly.

17. The plasma display device of claim 15, wherein the reinforcing members are formed with a material having a rigidity greater than the structural rigidity of the chassis base.

18. The plasma display device of claim 15, wherein the reinforcing members are fitted to a center of the chassis base.

19. The plasma display device of claim 15, wherein curvature of the chassis base is the same as the curvature of the plasma display panel.

20. The plasma display device of claim 15, wherein the chassis base is bent in a direction opposite to a direction of bending of the plasma display panel.

* * * * *